(12) United States Patent
Nakayama (10) Patent No.: US 6,950,349 B2
(45) Date of Patent: Sep. 27, 2005

(54) NONVOLATILE SEMICONDUCTOR MEMORY HAVING PARTIAL DATA REWRITING FUNCTION

(75) Inventor: Tomohiro Nakayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 165 days.

(21) Appl. No.: 10/600,767

(22) Filed: Jun. 23, 2003

(65) Prior Publication Data

US 2004/0001370 A1 Jan. 1, 2004

(30) Foreign Application Priority Data

Jun. 28, 2002 (JP) ........................................ 2002-189350

(51) Int. Cl.[7] ................................................. G11C 7/00
(52) U.S. Cl. ............................ 365/189.07; 365/189.01; 365/230.08
(58) Field of Search ........................ 365/189.01, 189.07, 365/230.08, 230.01

(56) References Cited

U.S. PATENT DOCUMENTS

| | | | | |
|---|---|---|---|---|
| 5,309,393 A | * | 5/1994 | Sakata et al. | 365/189.01 |
| 5,485,595 A | * | 1/1996 | Assar et al. | 711/103 |
| 5,563,828 A | * | 10/1996 | Hasbun et al. | 365/185.33 |
| 5,838,614 A | * | 11/1998 | Estakhri et al. | 365/185.11 |
| 5,907,856 A | * | 5/1999 | Estakhri et al. | 711/103 |
| 6,223,308 B1 | * | 4/2001 | Estakhri et al. | 714/42 |
| 6,772,274 B1 | * | 8/2004 | Estakhri | 711/103 |

FOREIGN PATENT DOCUMENTS

| | | | | |
|---|---|---|---|---|
| JP | 08-315596 | | 11/1996 | |
| JP | 409045091 A | * | 2/1997 | G11C/16/06 |
| JP | 02001118391 A | * | 4/2001 | G11C/16/02 |
| JP | 2002016232 | * | 1/2002 | H01L/27/05 |

* cited by examiner

*Primary Examiner*—Viet Q. Nguyen
(74) *Attorney, Agent, or Firm*—Arent Fox PLLC (57) ABSTRACT

A nonvolatile semiconductor memory is provided with a main memory array and a sub-memory array. When rewriting a portion of data having been written in the main memory cell array, a modification data is written into the sub-memory cell array without erasing said main memory cell array. Further, correspondent information on a first address of the main memory cell array storing a data to be modified and a second address of the sub-memory cell array storing the modification data is recorded. At the time of a readout operation, a readout address is compared with the first address recorded in the correspondent information. When said comparison result indicates consistency, a data in the sub-memory cell array of the second address corresponding to the first address is read out. Otherwise, when the comparison result indicates inconsistency, a data in the main memory cell array corresponding to the readout address is read out.

14 Claims, 13 Drawing Sheets

FIG. 1

PRIOR ART

FIG. 2

PRIOR ART

NONVOLATILE SEMICONDUCTOR MEMORY HAVING PARTIAL DATA REWRITING FUNCTION

CROSS-REFERENCE TO RELATED APPLICATIONS

This application is based upon and claims the benefit of priority from the prior Japanese Patent Application No. 2002-189350, filed on Jun. 28, 2002, the entire contents of which are incorporated herein by reference.

FIELD OF THE INVENTION

The present invention relates to a nonvolatile semiconductor memory such as a flash memory, and more particularly to a nonvolatile semiconductor memory capable of partial rewriting of data without performing an era se operation.

BACKGROUND OF THE INVENTION

A nonvolatile semiconductor memory, such as a flash memory, is constituted of memory cells each having a transistor including a floating gate or a trap gate. A state having no charges injected into the floating gate or the trap gate is an erase state (data '1'), and a state having charges injected into them is a program state (data '0'). A threshold voltage of the cell transistor becomes low in the erase state, while a threshold voltage becomes high in the program state. A write operation (or program operation) which injects charges into the floating gate, etc. changes data '1' to data '0'. An erase operation which removes or neutralizes the charges changes data '0' to data '1'.

Figure 1:
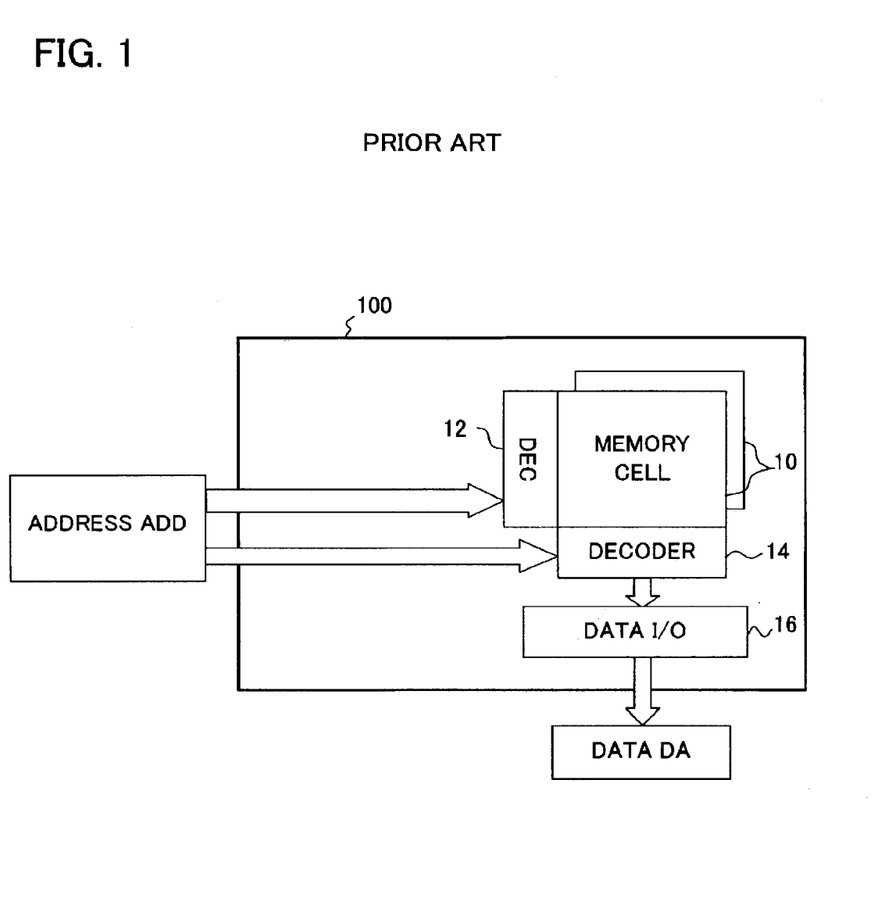
FIG. 1 shows a configuration diagram of a conventional nonvolatile memory.

FIG. 1 shows a configuration diagram of a conventional nonvolatile memory. This memory device 100 includes memory cell array 10, row decoder 12, column decoder 14, and data input/output circuit 16. Memory cell array 10 is constituted of a plurality of blocks each having a plurality of memory cells. In such a nonvolatile memory, the write operation writes a write data into a designated address. The erase operation simultaneously places the memory into the erase state on a block-by-block basis.

Figure 2:
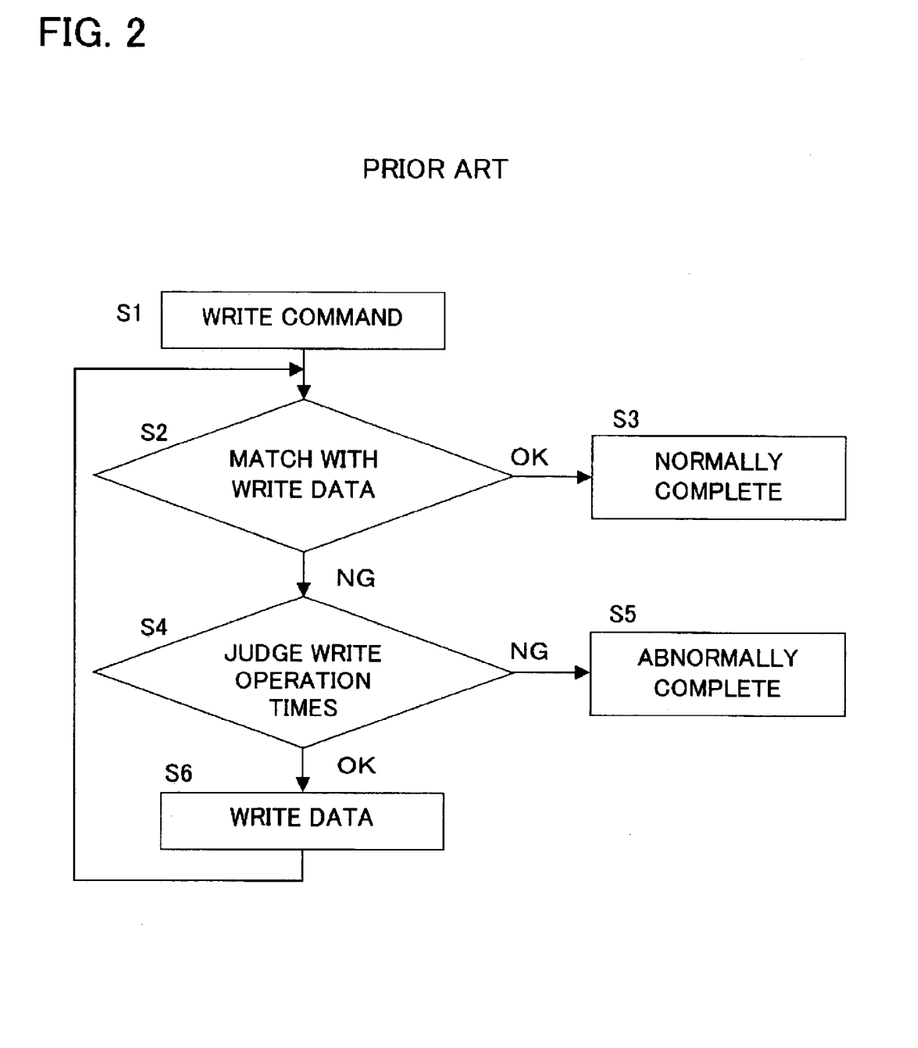
FIG. 2 shows a flowchart of a write operation performed in the conventional nonvolatile memory.

FIG. 2 is a flowchart of the write operation performed in the conventional nonvolatile memory. First, an address ADD and a write data DA are input from outside together with a write command (step S1). Decoders 12, 16 select a non-illustrated word line and a bit line corresponding to address ADD. The write data is written into the memory cell at the intersection of the selected word line and the selected bit line (S6). When consistency between the data having been written into the memory and the write data is, verified after the write operation (S2), the write operation is successfully completed (S3). On the hand, when the above-mentioned consistency cannot be verified, the write operation S6 is repeated until the number of write operation reaches a predetermined times (S4). When the number of write operation exceeds a predetermined number, the operation is abnormally terminated as an abnormal write operation (S5).

In the flash memory, as mentioned earlier, the write operation is performed in such a way that a data is written into a memory cell(s) corresponding to a designated address. Namely, a data is written into a memory cell on a bit-by-bit basis selected by the address, or memory cells on a basis of a memory cell group consisting of one byte, one word, or the like which is selected by the address. Or, in some cases, the data is written into a memory cell group specified on a word line basis selected by the address. Such a write operation is performed by changing the memory cell in the erase state (data '1') to data '0'. In contrast, the erase operation is performed on a block (or sector) basis, which contains multiple units of memory cells in the write operation, or on a chip-by-chip basis. Typically, in the erase operation, the entire memory cells included in an object block of the erase operation are once changed into the program state (data '0'), and thereafter these memory cells are simultaneously placed into the erase state (data '1'). This method is also applied when erasing on a chip-by-chip basis.

In a flash memory, a program or a predetermined data are written. When modification of only a part of the program or the data once written to the flash memory is desired, it is necessary to erase the memory block of interest once, and rewrite the whole program or data which is partially modified. In other words, because there is no other way than erasing on a block basis, the entire data in the block must once be erased and thereafter the data must be rewritten including the part which is intrinsically unnecessary to modify. This must be applied even when an extremely small portion of data in the block is to modify.

Thus, when a request for partial rewrite occurs in the conventional nonvolatile memory, it is necessary to erase the memory block in which the data to be modified is recorded, and rewrite a new data a part of which has been prepared for modification. As a result, rewrite processing in the conventional nonvolatile memory becomes complicated, requires substantially long time for rewriting, and yields the erace times being increased. Such operations of erasing and rewriting the whole data which is required even when modifying an extremely small data portion produces users' inconvenience.

SUMMARY OF THE INVENTION

Accordingly, it is an object of the present invention to provide a nonvolatile semiconductor memory having a partial rewrite function.

It is also an object of the present invention to provide a nonvolatile semiconductor memory which enables partial modification of written data without accompanied by an erase operation on a block-by-block or a chip-by-chip basis.

As one aspect of the present invention to attain the aforementioned objects, a nonvolatile semiconductor memory is provided with a main memory array and a sub-memory array. When rewriting a portion of data having been written in the main memory cell array, a modification data is written into the sub-memory cell array without erasing said main memory cell array. Further, correspondent information on a first address of the main memory cell array storing a data to be modified and a second address of the sub-memory cell array storing the modification data is recorded. At the time of a readout operation, a readout address is compared with the first address recorded in the correspondent information. When said comparison result indicates consistency, a data in the sub-memory cell array of the second address corresponding to the first address is read out. Otherwise, when the comparison result indicates inconsistency, a data in the main memory cell array corresponding to the readout address is read out.

According to the aforementioned aspect of the present invention, when only a portion of data having been written is to modify, a modification data is written into the sub-memory cell array without erasing the memory block concerned. At the same time, the correspondent information on the first address of the main memory cell array to be modified and the second address of the sub-memory cell array storing the modification data is recorded. Thus, because only the modification data is written in the sub-memory cell array, the rewrite operation takes place at high speed in a simple manner. Also, it becomes possible to prevent the number of the erase times from increasing.

In one aspect of the present invention, preferably the nonvolatile semiconductor memory includes a memory block, which forms a unit of erasing, having both the main memory cell array and the sub-memory cell array. At the time of erasing the memory block concerned, data which are stored not only in the main memory cell array but also the sub-memory cell array in the memory block are erased together. Therefore, when the main memory cell array is changed into an erase state, the sub-memory cell array also falls into the erase state. Thus the sub-memory cell array can be reused to perform the rewrite function.

Further scopes and features of the present invention will become more apparent by the following description of the embodiments with the accompanied drawings.

DETAILED DESCRIPTION OF THE PREFERRED EMBODIMENTS

The preferred embodiment of the present invention is described hereinafter referring to the charts and drawings. It is to be noted that the scope of protection in accordance with the present invention shall not be limited to the embodiments described hereinafter. The scope of the present invention runs to the inventions as described in the claims and the equivalents thereof.

Figure 3:
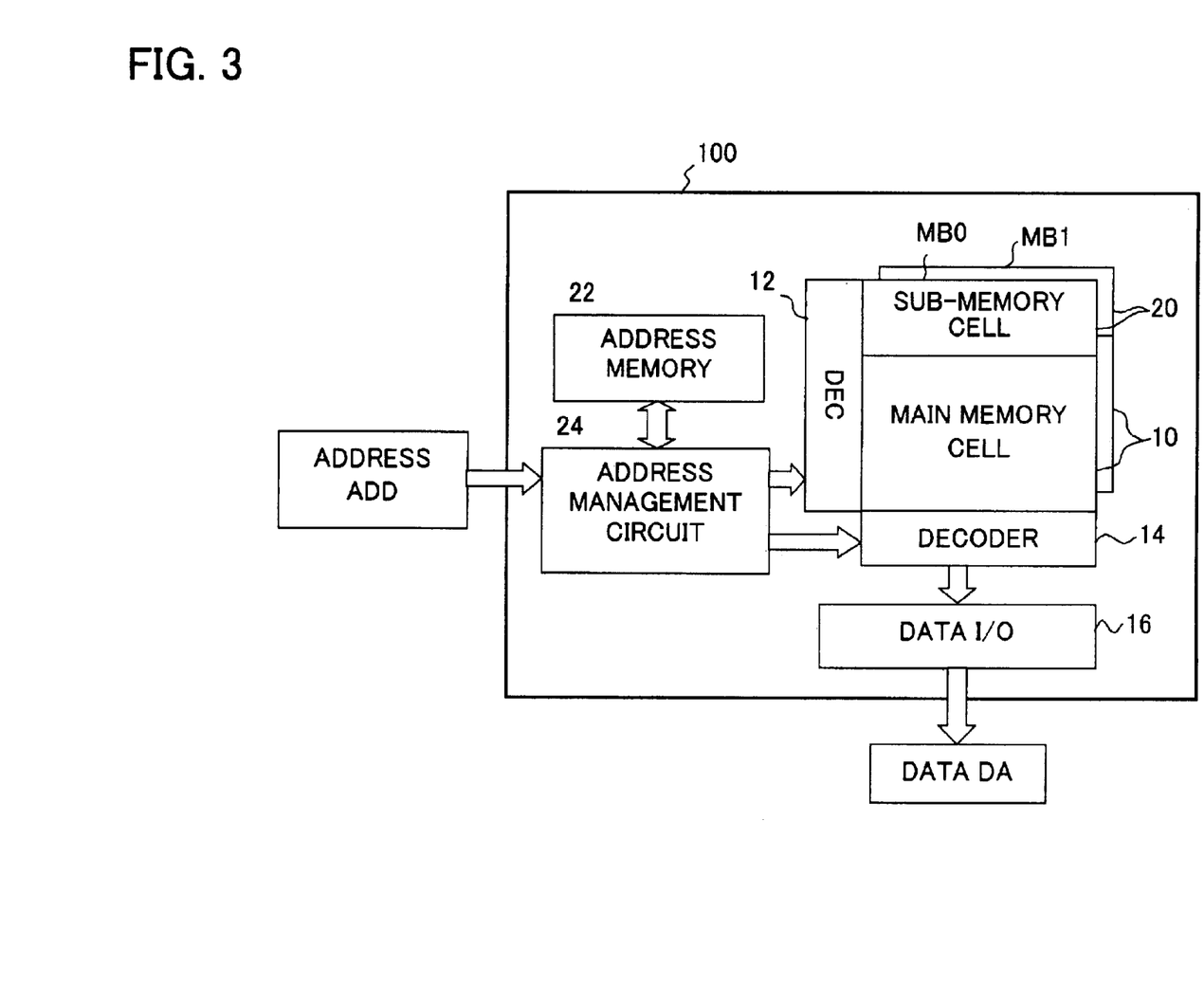
FIG. 3 shows a configuration diagram of a nonvolatile memory according to one embodiment of the present invention.

FIG. 3 shows a configuration diagram of a nonvolatile memory according to one embodiment of the present invention. This nonvolatile memory unit 100 (hereinafter represented by a flash memory unit as a typical example) includes a memory cell array, which is constituted of a main memory cell array 10 and a sub-memory cell array 20. Memory blocks MB0, MB1, each constituting a unit of erasing, respectively include the above-mentioned main memory cell array 10 and sub-memory cell array 20. In the example shown in the figure, sub-memory cell array 20 is provided in a row direction. Similar to a conventional unit, flash memory unit 100 includes a row decoder 12, column decoder 14, data input/output circuit 16, and a non-illustrated control circuit which controls write, erase, and readout operations in response to related commands.

Flash memory unit 100 shown in FIG. 3 further includes an address memory 22, which memorizes at the time of rewriting the correspondent information on a first address of the main memory cell array storing a data to be modified (i.e. current data) and a second address of the sub-memory cell array storing a modification data (update data). Flash memory unit 100 also includes an address management circuit 24, which writes the above-mentioned correspondent information into address memory 22 at the time of the write operation, and also compares a readout address ADD supplied from outside and the first address memorized in the address memory 22 at the time of the readout operation.

The rewrite operation in this flash memory 100 will be explained hereafter. First, a memory block lies in the erase state, and therefore both main memory cell array 10 and sub-memory cell array 20 in the memory block of interest lie in the erase state. A predetermined data such as program, database, and the like is written into main memory cell array 10 which lies in the erase state. More strictly, when the data to be written to is '0', a cell transistor is changed from a state of data '1', or erase state, to a state of data '0', or program state. Meanwhile, when the data to be written to is '1', the cell transistor is kept unchanged, and therefore remained in the erase state.

Next, when only a portion of the data having been written is intended to rewrite, conventionally, the entire memory block in which the data of interest has been written is completely erased. Instead, according to the present invention, the modification data is written into sub-memory cell array 20. Also, the correspondent information containing a relation of correspondence between the first address of main memory cell array 10, which stores the data to be modified, and the second address of sub-memory cell array 20, which stores the modification data, is written into address memory 22.

Figure 5:
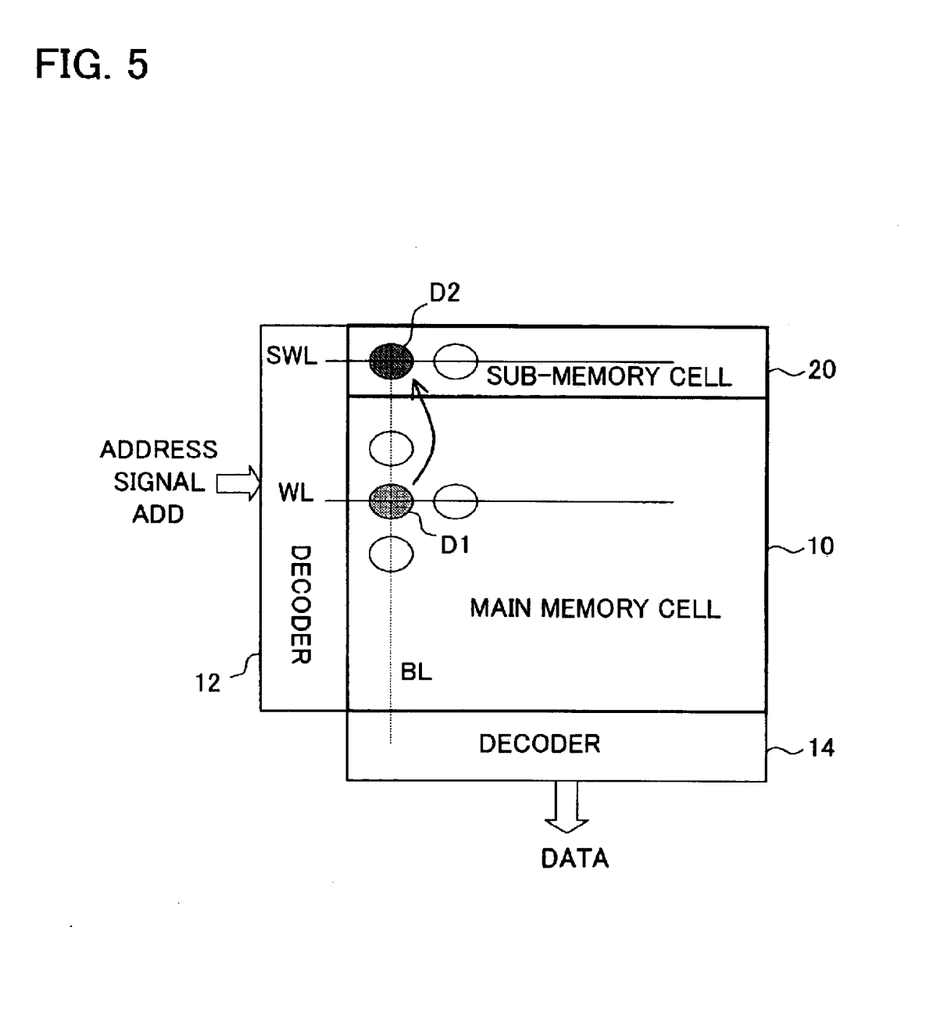
FIG. 5 shows a diagram illustrating a unit of selection selected by an address in a memory cell array.

FIG. 5 shows a diagram illustrating a unit of selection which is selected by an address in the memory cell array. As shown in this FIG. 5, by decoding address ADD, a word line WL is selected and driven. As a result, a plurality of memory cells disposed in a row direction are selected. Here, the number of bits which are simultaneously output is different, depending on the configuration of the memory cell array. For-example, an access unit of 8 bits or 16 bits is selected by one address, and an access is made thereto. A unit of this access is shown by ellipses in FIG. 5.

In the above-mentioned rewrite operation, a data D1 to be rewritten, which belongs to a word line WL in main memory cell array 10, is maintained in the main memory cell array without alteration, and a new data D2 prepared for rewriting is written into a memory cell (s), or a unit of access, which belongs to a word line SWL disposed in sub-memory cell array 20. Accordingly, in the address memory 22 shown in FIG. 3, the correspondent information related to the row address in main memory cell array 10 and the row address in sub-memory cell array 20 is written.

Figure 6:
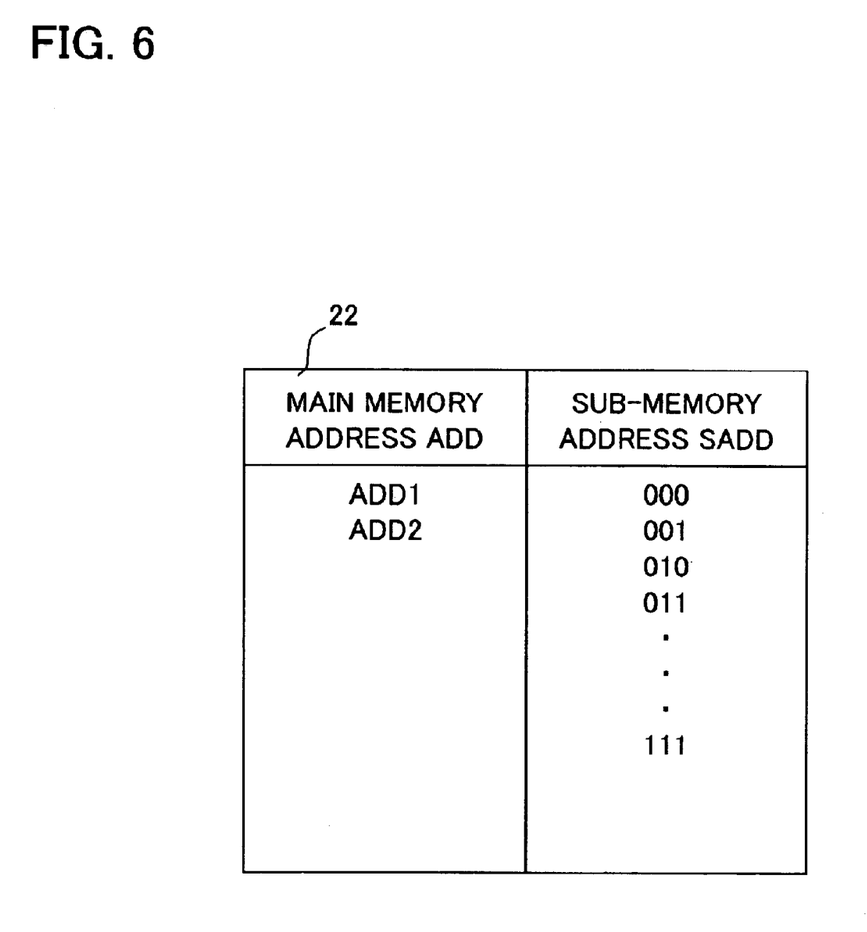
FIG. 6 shows a diagram illustrating a typical example of an address memory 22.

FIG. 6 is a diagram illustrating a typical configuration of address memory 22. In this address memory 22, the correspondent information of the first address ADD of main memory cell array 10 and the second address SADD of sub-memory cell array 20 is recorded. In the example shown in FIG. 6, address SADD of sub-memory cell array 20 is actually constituted of 8 addresses, '000' to '111'. Each time a modification data is written into sub-memory cell array 20 through the rewrite operation, addresses ADD1 and ADD2 which constitute the first address of main memory cell array 10 are successively written into address memory 22.

Namely, in the rewrite operation, address ADD of the data to be modified and modification data are supplied to memory unit 100 together with a write command. Address management circuit 24 then writes the supplied address ADD into address memory 22, and outputs to decoder 12 address SADD of sub-memory cell array 20 corresponding to the supplied address ADD. In addition to this operation, the modification data is written into sub-memory cell array 20.

Figure 7:
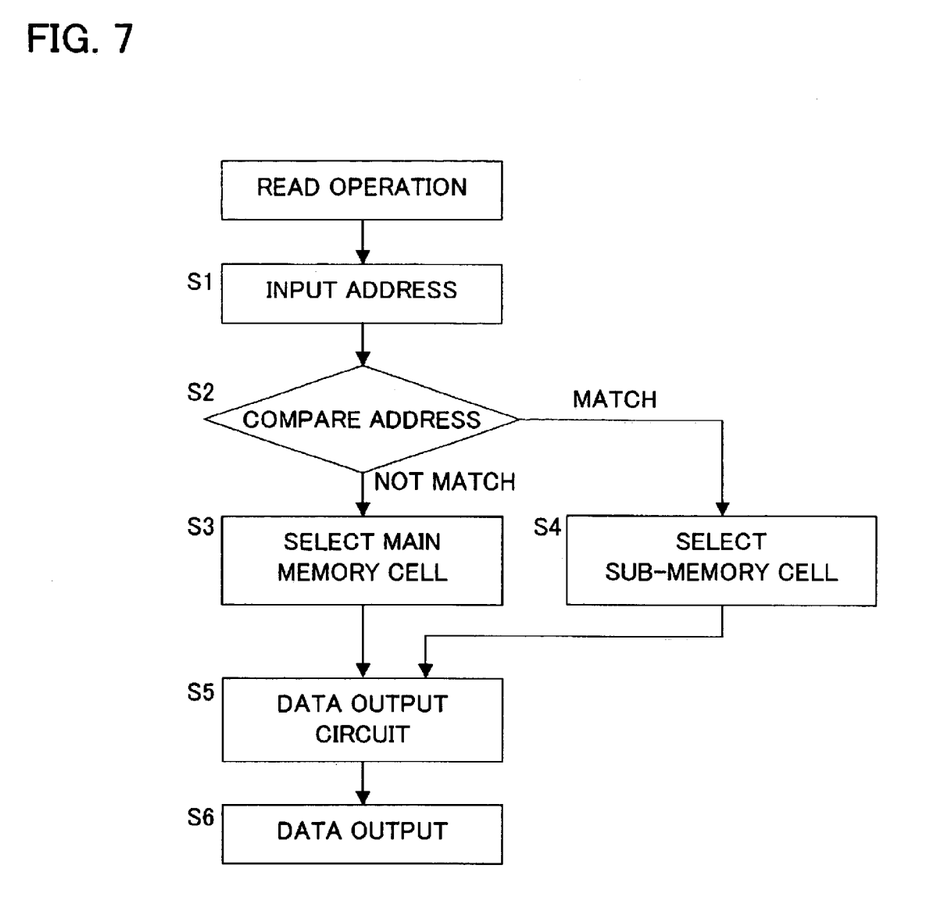
FIG. 7 shows a flowchart of a readout operation.

FIG. 7 shows a flowchart of a readout operation. In the readout operation, an address of a readout object is input (step S1). Address management circuit 24 then compares this readout address with the first address of main memory cell array 10 stored in address memory 22 (S2) When these addresses do not match, address management circuit 24 outputs the supplied readout address to decoder 12 without modification, and thus a data in main memory cell array 10 is output (S3, S5 and S6). On the other hand, when those addresses match, address management circuit 24 outputs address SADD of sub-memory cell array 20 corresponding to the readout address to decoder 12, because the data of the readout address has been rewritten. In such a way, the modification data in sub-memory cell array 20 is output (S4, S5 and S6).

The above-mentioned rewrite operation is executable as long as memory cells to which new data can be written are left in sub-memory cell array 20. When sub-memory cell array 20 becomes fully occupied, the above-mentioned rewrite operation becomes no further executable. Such a case produces write error, and the erase operation is performed to the memory block MB concerned. This erase operation brings both main memory cell array 10 and sub-memory cell array 20 in the memory block of interest into the erase state. Therefore, after this erase operation, the above-mentioned rewrite operation using sub-memory cell array 20 becomes executable again. At the time of this erase operation, the first address in address memory 22 is also erased.

Figure 4:
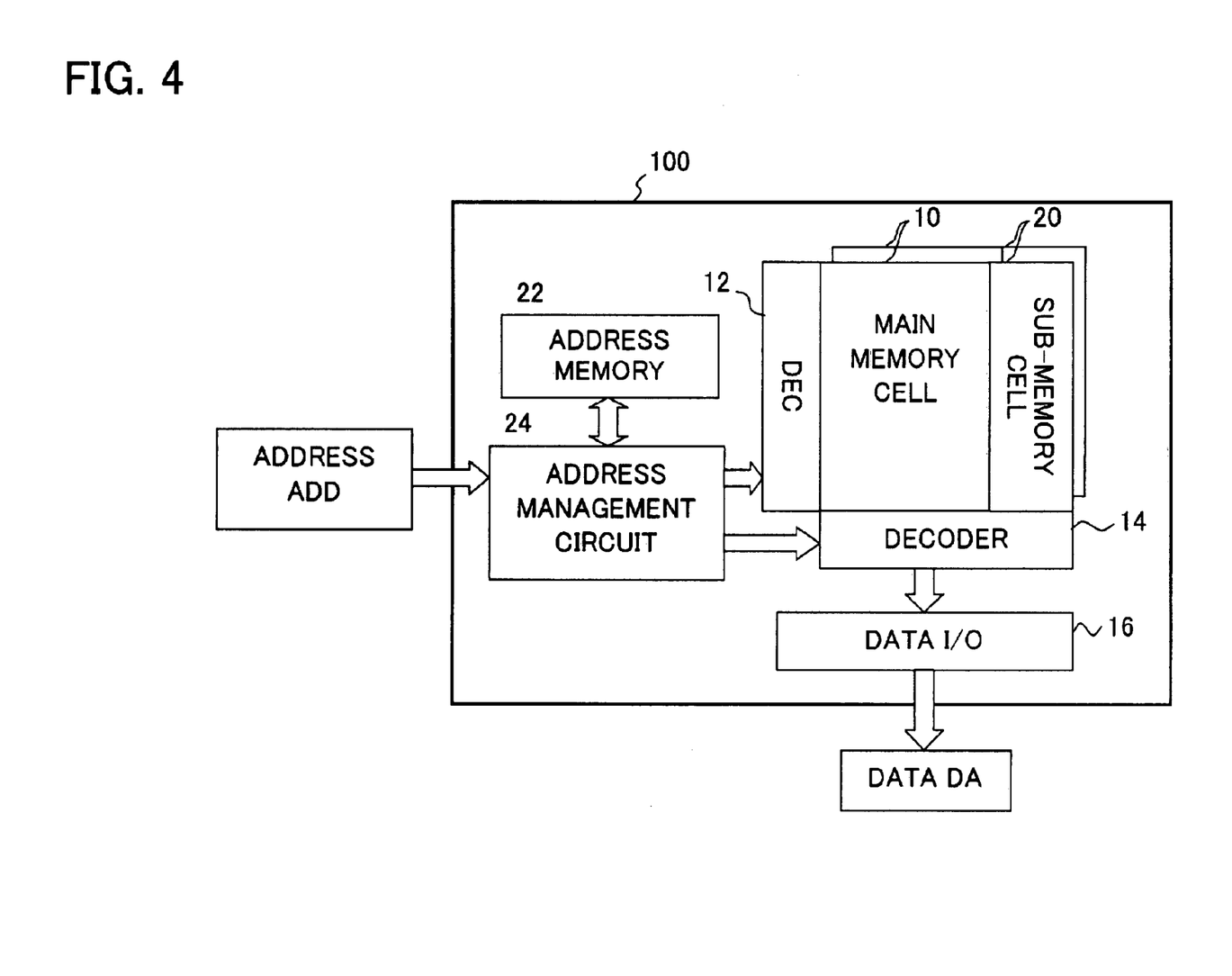
FIG. 4 shows a configuration diagram of a nonvolatile memory according to another embodiment of the present invention.

FIG. 4 shows a configuration diagram of a nonvolatile memory according to another embodiment of the present invention. In this embodiment, a sub-memory cell array 20 is provided in a column direction. Accordingly, in this embodiment, the correspondent information on a first column address of main memory cell array 10 which stores a data to be modified and a second column address of sub-memory cell array 20 which stores a modification data is memorized in address memory 22. In this case, address management circuit 24 compares both column addresses, and appropriately outputs to decoder 14 a column address of sub-memory cell array 20 according to the correspondent information stored in address memory 22.

As another embodiment, it may also be possible that sub-memory cell array 20 is constituted of both configurations shown in FIGS. 3 and 4. In this embodiment, address memory 22 is required to memorize the correspondent information for both the row address and the column address.

As can be appreciated from the above explanation, according to the embodiments of the present invention, a rewrite operation modifying a portion of data having been stored can simply be performed by writing a modification data into a sub-memory cell array, requiring neither erase operation nor rewriting a data portion which is inherently unnecessary to rewrite. As a result, the rewrite operation can virtually be performed by supplying from outside a write command, an address of the data to be modified, and a modification data only.

The above-mentioned rewrite operation may be performed under a special mode different from a normal write operation mode, or otherwise the same mode as the normal write operation mode.

Figure 8:
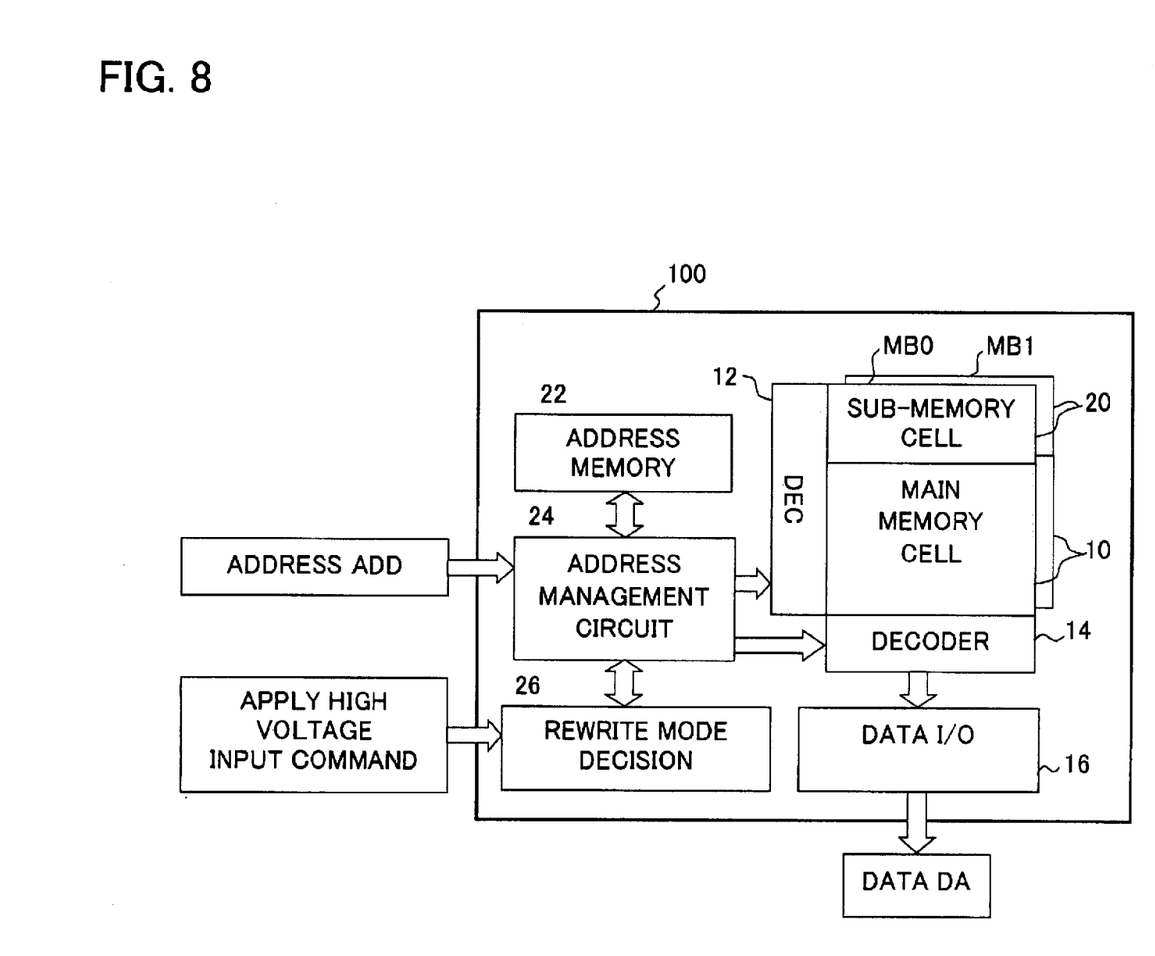
FIG. 8 shows a configuration diagram of a nonvolatile memory unit in which a rewrite operation is performed under a particular mode.

FIG. 8 shows a configuration diagram of a nonvolatile memory unit in which the rewrite operation is performed under the special mode. In this figure, like numerals refer to like parts shown in FIG. 3. Different from the memory unit configuration shown in FIG. 3, there is provided a rewrite mode decision circuit 26 in the configuration of this embodiment. Either by applying a voltage higher than that applied in the normal operation to a predetermined external pin, or by supplying a command indicating the rewrite mode, rewrite mode decision circuit 26 detects the rewrite mode, and informs address management circuit 24 that the mode has been changed into the rewrite mode.

Figure 9:
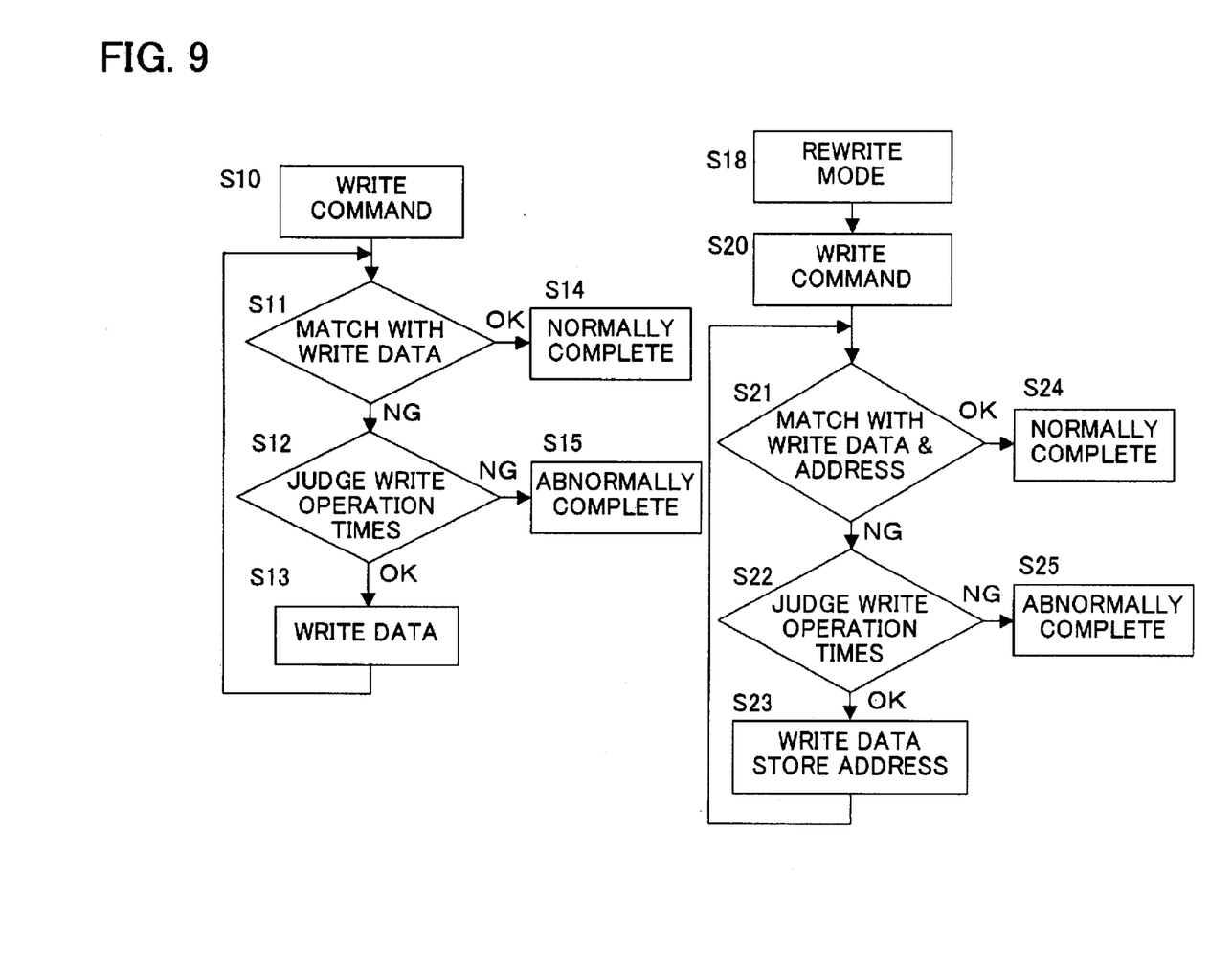
FIG. 9 shows a flowchart of the write operation performed in the nonvolatile memory shown in FIG. 8.

FIG. 9 shows a flowchart of the rewrite operation performed in the nonvolatile memory unit shown in FIG. 8. The normal write operation is shown on the left side, while the rewrite operation for modifying a portion of data is shown on the right side. Procedure steps S10–S15 for the normal write operation are identical to the conventional write operation shown in FIG. 2. Namely, when a write address and a write data are supplied together with a write command (S10), data write processing S13 is performed repeatedly until a set of the write data is completely written into main memory cell array 10. When coincidence between the write data and the data having been written are verified, the process is successfully completed (S14). Otherwise, when the write operation cannot be completed in spite of the write processing performed for a predetermined number of times, it is regarded a malfunction has occurred, and an indication of the abnormal write operation is output (S15).

Next, the rewrite operation is started when the memory unit receives a higher voltage than in the normal operation on a predetermined external terminal, or a predetermined rewrite mode command, by which the memory unit enters the rewrite operation mode (S18). Rewrite mode decision circuit 26 determines this mode, and informs address management circuit 24 of this rewrite mode detection.

Thereafter, a first address of main memory cell array 10 storing the data to be modified, and a modification data are supplied together with a write command (S20). Address management circuit 24 detects a second address of sub-memory cell array 20 in address memory 22 in which a data can be written, and writes the supplied first address into address memory 22 corresponding to the detected second address. Address management circuit 24 then outputs the second address to decoder 12, and writes the modification data into the second address of sub-memory cell array 20 (S23). This write processing is repeated until the write data is successfully written into sub-memory cell array 20, as well as the first address is successfully written into address memory 22 (S21). When the write processing is successful, the process is completed (S24). If the write processing fails and exceeds a predetermined number of times, the process is terminated as an abnormal end (S25).

In such a way, when a portion of data is to modify, the memory unit shown in FIG. 8 once enters the rewrite mode. Thereafter an address for a data to be modified and a modification data are supplied in a similar manner to the normal write operation. Then, the modification data is written into sub-memory cell array 20.

Figure 10:
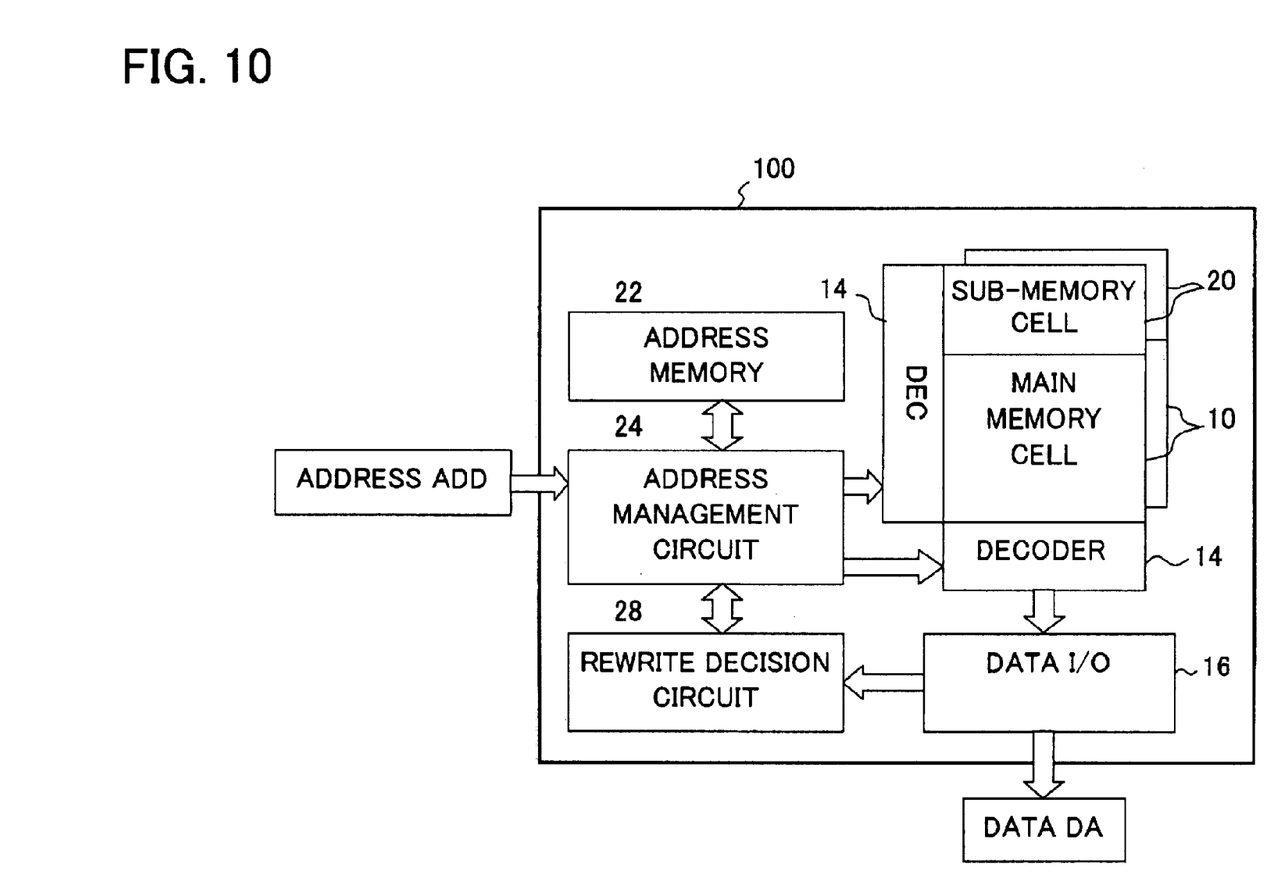
FIG. 10 shows a configuration diagram of a nonvolatile memory unit which automatically performs the rewrite operation.
Figure 11:
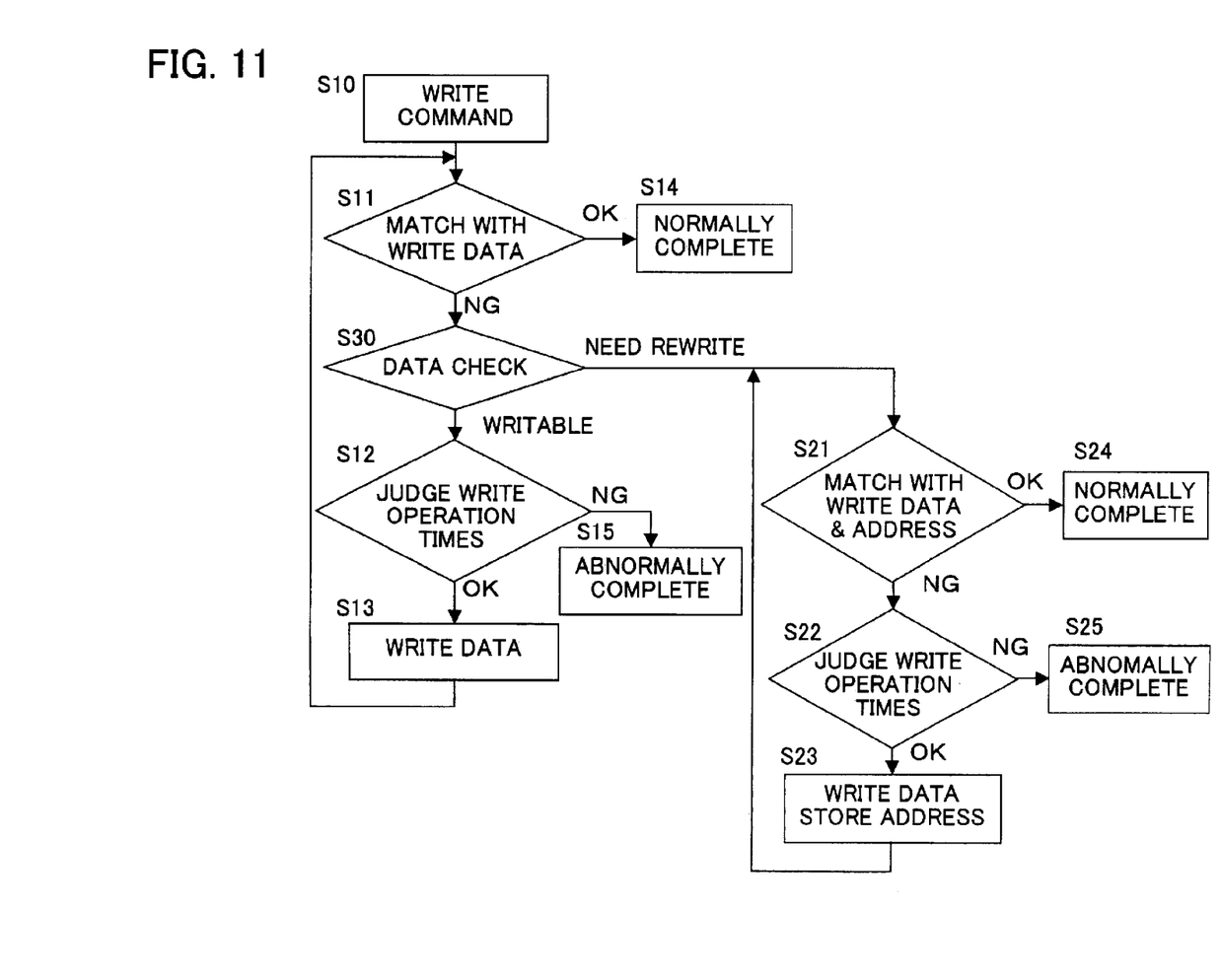
FIG. 11 shows a flowchart of the write operation performed in the nonvolatile memory unit shown in FIG. 10.

FIG. 10 shows a configuration diagram of a nonvolatile memory unit in which the rewrite operation is performed automatically. Also, FIG. 11 shows a flowchart of the write operation. In this memory unit, there is provided a rewrite decision circuit 28, which determines whether or not the write data is to be written into sub-memory cell array 20.

When write address ADD and write data DA are supplied together with a write command, rewrite decision circuit 28 reads out a data stored in write address ADD of main memory cell array 10, and checks whether or not write data DA can be written into address ADD of main memory -cell array 10. In this decision, the readout data is compared-with the write data, so as to check whether there is any bit required to change from data '0' to data '1'. In other words, it is checked whether or not the erase operation is necessary.

The write operation is an operation to change from data '1' (erase state) to data '0' (program state). In contrast, the erase operation performed on a block-by-block basis is an operation to change the entire memory cells in the block of interest to data '1'.

When there exists a bit required to change from data '0' to data '1', it is not possible to write the supplied write data into main memory cell array 10. In such a case, it is determined as the rewrite operation, which requires the write data to be written into sub-memory cell array 20. On the contrary, as a result of comparison, when there exist only a bit required to change from data '1' to data '0' and/or a bit which is not required to change, it is possible to write the write data of interest directly into main memory cell array 10. Typically, this case occurs when main memory cell array 10 lies in the erase state. Also, this may occur even in the case when some data has already been written into the memory, although it may not be frequent.

Referring to a flowchart shown in FIG. 11, the write operation will be explained hereafter. A user supplies write address ADD and write data DA, together with a normal write command, to the memory unit (S10). Except for a case that a data having been stored in the write address of main memory cell array 10 is coincident with the write data (S11), rewrite decision circuit 28 compares the above-mentioned data. As a result, when it is found that the main memory cell array 10 of interest lies in the erase state, or has a combination of data which happens to be able to write, the write operation into main memory cell array 10 is performed through steps S12, S13 and S11.

To the contrary, the rewrite operation shown in procedure steps S21 to S25 is executed when rewrite decision circuit 28 determines that a certain data has already been stored in the address of interest in main memory cell array 10, and that it is not possible to rewrite the supplied write data under this state. Procedure steps S21 to S25 are identical to the corresponding steps of the rewrite operation having been explained in FIG. 9. Namely, address management circuit 24 supplies the second address of sub-memory cell array 20 to decoder 14, in place of the supplied first address of main memory cell array 10, and writes into address memory 22 the first address correspondent to the second address. Also, the supplied write data is written into the second address of sub-memory cell array 20 as a modification data.

In the nonvolatile memory unit shown in FIGS. 8 and 10, the readout operation is the same as the operation shown in FIG. 7. Namely, address management circuit 24 detects whether or not a readout address which is supplied with a normal read command is coincident with the first address stored in address memory 22. When these addresses are coincident, the second address corresponding to the first address is supplied, to decoder 12, and the data stored in the second address of sub-memory cell array 20 is read out. Meanwhile, when the above-mentioned two addresses are not coincident, the data in accordance with the supplied readout address is read out from main memory cell array 10.

In the nonvolatile memory unit shown in FIGS. 8 and 10, the erase operation is the same as the operation shown in FIGS. 3 and 4. Namely, when,a data in main memory cell array 10 is to erase, a data in sub-memory cell array 20 which belongs to the memory block concerned is erased together. AS a result of this erase operation, even if once the vacant area in sub-memory cell array 20 are entirely consumed, it becomes possible to resume the rewrite operation for modifying a partial data using sub-memory cell array 20.

Figure 12:
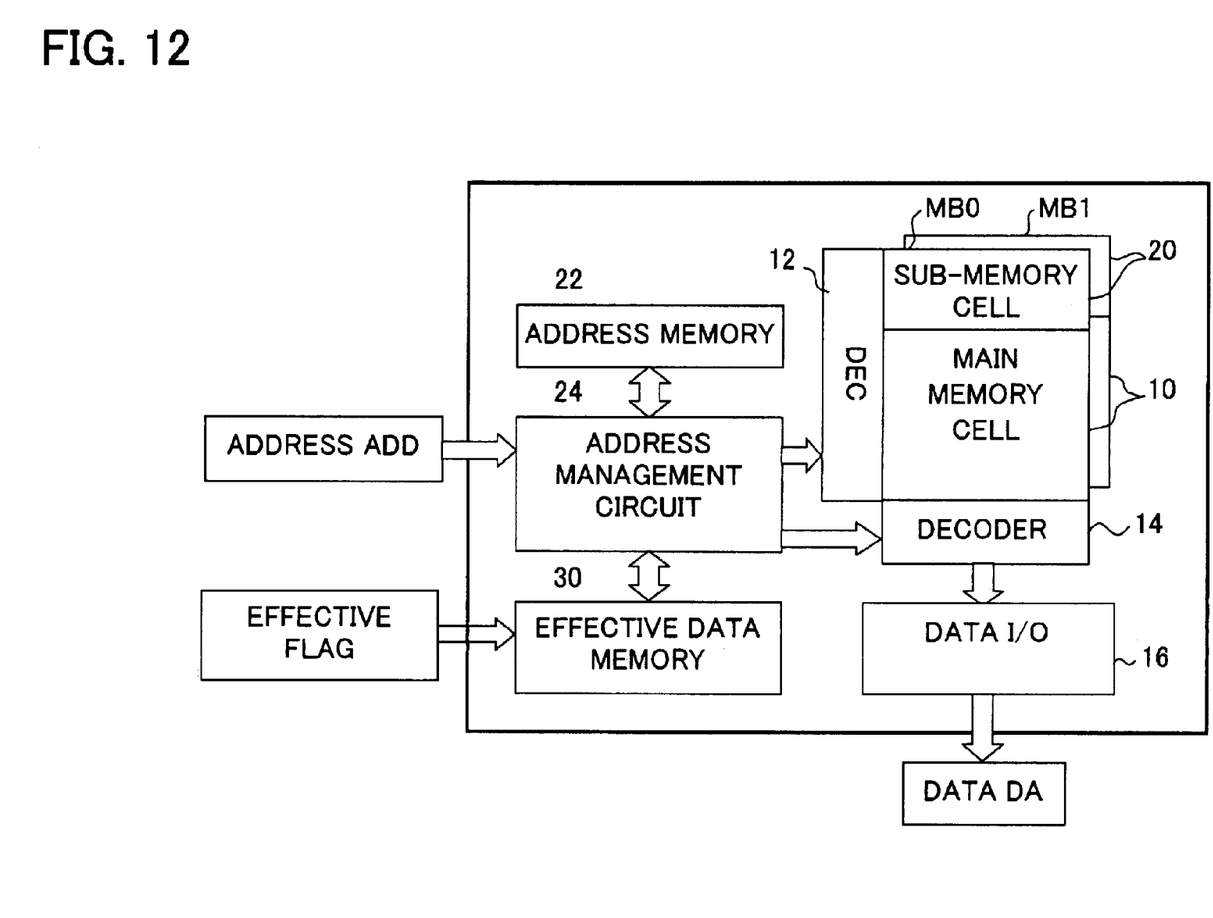
FIG. 12 shows a configuration diagram of a nonvolatile memory according to another embodiment of the present invention.

FIG. 12 shows a configuration diagram of the nonvolatile memory unit in accordance with another embodiment of the present invention. This memory unit has the rewrite function for modifying a partial data, similar to the aforementioned embodiment. In addition, there is provided a function of selecting effective data, by which either the original data before rewriting or the rewrite data after rewriting is made effective in a selectable manner. For this purpose, an effective data memory 30 is provided. An effective flag indicating which data, either the original data or the rewrite data, is to be effective is stored in this effective data memory 30.

While the effective flag indicates that the original data should be effective, the original data are read out from main memory cell array 10 through the read out operation. On the other hand, while the effective flag indicates that the rewrite data should be effective, an appropriate data stored in sub-memory cell array 20 is read out, in place of the data stored in main memory cell array 10, by the function of address management circuit 24.

Figure 13:
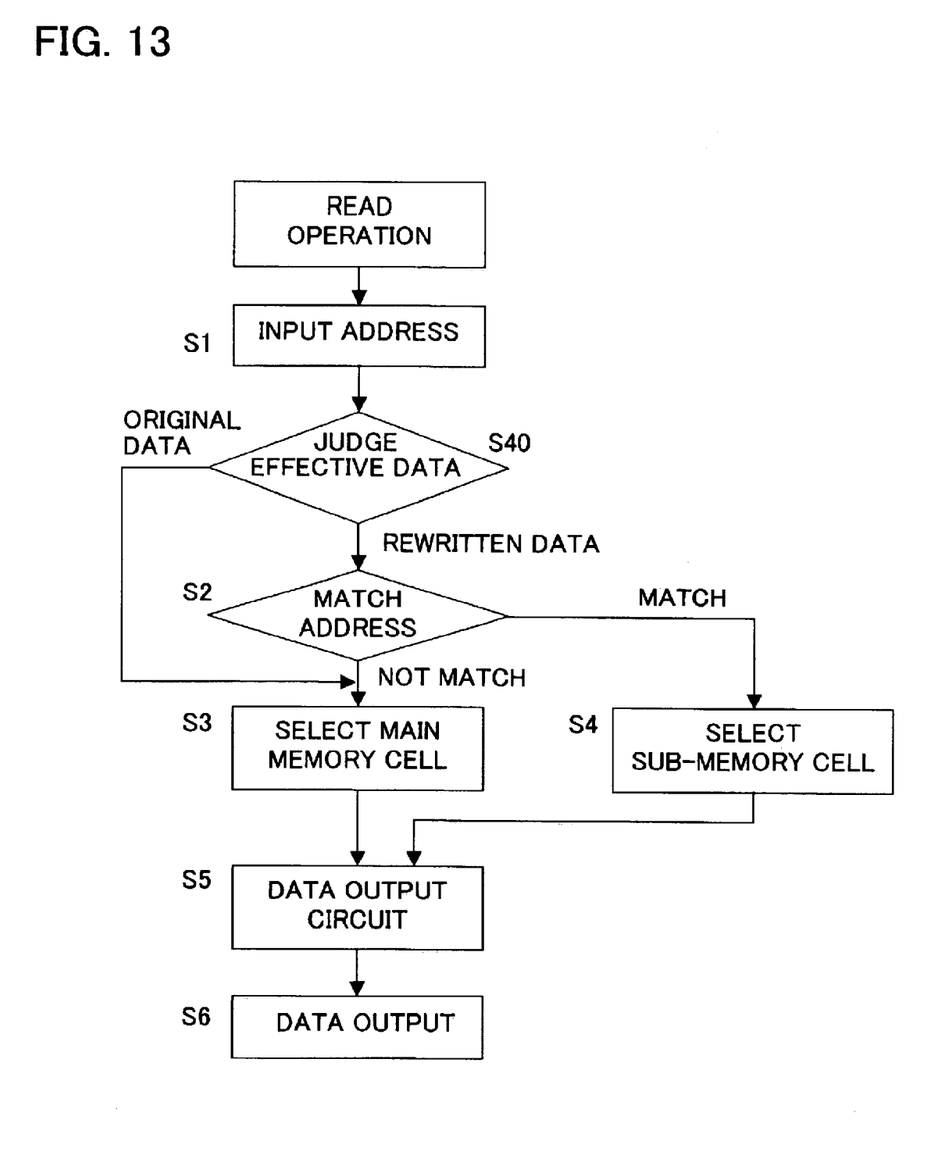
FIG. 13 shows a flowchart of the readout operation performed in the memory unit shown in FIG. 12.

FIG. 13 shows a flowchart of the readout operation performed in the memory unit shown in FIG. 12. This readout operation is partly different from that shown in FIG. 7. More specifically, when a readout address is input together with a readout command (S1), address management circuit 24 checks the effective flag stored in effective data memory 30, and detects whether the original data or the rewrite data be effective (S40). This procedure step S40 differs from the step in the flowchart shown in FIG. 7.

When the rewrite data is specified as the effective data, address management circuit 24 compares the supplied readout address with the first address stored in address memory 22. When these addresses match, the corresponding second address is output to the decoder and the modification data stored in sub-memory cell array 20 is read out. When the aforementioned addresses do not match as a result of comparison, the data corresponding to the first address stored in main memory cell array 10 is readout, in a similar manner to FIG. 7. Thus, when there has been stored a rewrite data, the data is read out, while when the rewrite data has not been stored, the original data is read out.

Meanwhile, when the original data is specified as the effective data, address management circuit 24 supplies the readout address having been supplied to decoder 12, without alteration, so that the data stored in main memory cell array 10 is read out. Accordingly, even when there has been stored any rewrite data, the original data is compulsorily read out from main memory cell array 10.

In such a way, the memory unit according to this embodiment of the present invention writes a modification data into sub-memory cell array 20 at the time of the rewrite operation, without erasing an original data. Therefore, both the original data and the rewrite data remain in the memory as recorded data. Because of such circumstances, it becomes possible to configure the memory having a capability of reading out either the original data or the rewrite data as an effective data. This is enabled by setting a flag indicating which data is to be effective in effective data memory 30, as mentioned above. This function may be of use when debugging in program development, for example, by comparing a partially modified program with an original program.

According to the aforementioned embodiment, only one version (generation) of the rewrite data can be stored in the memory. That is, an original data is stored in main memory cell array 10 and a modified portion (rewrite data) of the original data is stored in sub-memory cell array 20. As a measure against such limitation, it may also be possible to provide multiple sets of sub-memory cell array 20, thus enabling to provide a plurality of versions of the rewrite data. More specifically, the original data is stored in main memory cell array 10, a first version of the rewrite data is stored in a first sub-memory cell array, and a second version of the rewrite data is stored in a second sub-memory cell array. By providing in effective data memory 20 a flag memorizing which data among the original data, the rewrite data of the first version and the rewrite data of the second version should be specified as the effective data, it becomes possible to read out any data of a suitable version. In this case, it becomes necessary to store address correspondent information for the first version and the second version independently in address memory 22.

As can be understood, in order to write the rewrite data of multiple version by a simple rewrite operation, it is necessary to provide a multiple sets of sub-memory cell array 20. Even in this case, it is possible to prevent an increase in the capacity of sub-memory cell array 20 by restricting the modification data amount for rewriting. With such a means, the capacity of the sub-memory cell array 20 will not become extremely large even when a rewrite function is provided for multiple data versions.

To summarize, according to the present invention, it is possible to perform the rewrite operation for modifying a portion of the data having been written in a nonvolatile semiconductor memory in a simplified manner without accompanied by the erase operation.

What is claimed is:

1. A nonvolatile semiconductor memory comprising:
   a main memory cell array;
   a sub-memory cell array; and
   an address memory,
   wherein, in case of a rewrite operation rewriting a portion of data written in the main memory cell array, a modification data is written into the sub-memory cell array without erasing said main memory cell array, and correspondent information on a first address of the main memory cell array storing a data to be modified and a second address of the sub-memory cell array storing the modification data is recorded in the address memory.

2. The nonvolatile semiconductor memory according to claim 1, further comprising:
   an address management circuit which, at the time of a readout operation, compares a readout address with the first address of the correspondent information, and outputs the readout address when the comparison result indicates inconsistency, and outputs the second address of said correspondent information when the comparison result indicates consistency.

3. The nonvolatile semiconductor memory according to claim 1, further comprising:
   a rewrite mode decision circuit which detects a rewrite operation mode in response to an external signal,
   wherein, on detection of the rewrite operation mode, the modification data is written into the sub-memory cell array, and the correspondent information is recorded into the address memory.

4. The nonvolatile semiconductor memory according to claim 1,
   wherein, in response to a supplied write data and a supplied write address, a data in the main memory cell array corresponding to the write address is compared with the write data, and when the write data can be written into the main memory cell array, the supplied write data is written into said main memory cell array, and when the write data cannot be written into the main memory cell array, the supplied write data is written into the sub-memory cell array, and also the correspondent information is recorded into the address memory.

5. The nonvolatile semiconductor memory according to claim 1, further comprising:
   a memory block having the main memory cell array and the sub-memory cell array,
   wherein, at the time of an erase operation, data stored in both the main memory cell array and the sub-memory cell array within the memory block are erased together.

6. The nonvolatile semiconductor memory according to claim 5, further comprising:
   a plurality of the memory blocks,
   wherein, at the time of the erase operation, the data stored within a selected memory block are simultaneously erased.

7. The nonvolatile semiconductor memory according to claim 1,
   wherein, in the erase operation, the data stored in memory cells of the main memory cell array are simultaneously erased.

8. The nonvolatile semiconductor memory according to claim 1, further comprising:
   an effective data memory storing an effective flag indicating which of the data before rewriting or the data after rewriting is effective,
   wherein, at the time of a readout operation, when a first flag indicating the data before rewriting is effective is stored in the effective data memory, a data corresponding to the supplied readout address is read out from the main memory cell array, and
   when a second flag indicating the data after rewriting is effective is stored in the effective data memory, if the readout address is consistent with the first address included in the correspondent information, a data of the second address corresponding to the readout address is read out from the sub-memory cell array, or if the readout address is inconsistent with the first address, a data of the readout address is read out from the main memory cell array.

9. A nonvolatile semiconductor memory comprising:

a main memory cell array in which entire memory cells are set into an erase state by an erase operation, and a first data is written when the memory cells lie in the erase state;

a sub-memory cell array in which, at the time of a rewrite operation modifying a portion of the first data written in the main memory cell array into a second data, said modifying second data is written; and an address memory which stores correspondent information on a first address of the main memory cell array storing a data to be modified and a second address of the sub-memory cell array storing the second data, when said second data is written into the sub-memory cell array.

10. The nonvolatile semiconductor memory according to claim 9, wherein, at the time of a readout operation, a readout address is compared with the first address of the correspondent information, and when the comparison result indicates inconsistency, the first data corresponding to the readout address is output, and when said comparison result indicates consistency, the second data corresponding to the second address of said correspondent information is output.

11. The nonvolatile semiconductor memory according to claim 9, further comprising:

a rewrite mode decision circuit which detects a rewrite operation mode in response to an external signal, wherein, on detection of the rewrite operation mode, the second data is written into the sub-memory cell array and the correspondent information is recorded into the address memory.

12. The nonvolatile semiconductor memory according to claim 9, wherein, in response to a supplied write data and a supplied write address, a data stored in the main memory cell array corresponding to the write address is compared with the write data, and when the second data can be written into the main memory cell array, the supplied second data is written into said main memory cell array, and when the second data cannot be written into-the main memory cell array, the supplied second data is written into the sub-memory cell array, and also the correspondent information is recorded into the address memory.

13. The nonvolatile semiconductor memory according to claim 9, further comprising:

a memory block having the main memory cell array and the sub-memory cell array, wherein, at the time of an erase operation, data stored in both the main memory cell array and the sub-memory cell array in the memory block are erased together.

14. The nonvolatile semiconductor memory according to claim 9, further comprising:

an effective data memory storing an effective flag indicating which data of the first data or the second data is effective, wherein, at the time of a readout operation, when a first flag indicating the first data is effective is stored in the effective data memory, the first data corresponding to the supplied readout address is read out from the main memory cell array, and when a second flag indicating the second data is effective is stored in the effective data memory, if the readout address is consistent with the first address of the correspondent information, the second data of the second address corresponding to the readout address is read out from the sub-memory cell array, or if the readout address is inconsistent with the first address, the first data of the readout address is read out from the main memory cell array.

* * * * *